US010983859B2

(12) United States Patent
Davis et al.

(10) Patent No.: US 10,983,859 B2
(45) Date of Patent: Apr. 20, 2021

(54) ADJUSTABLE ERROR CORRECTION BASED ON MEMORY HEALTH IN A STORAGE UNIT

(71) Applicant: Pure Storage, Inc., Mountain View, CA (US)

(72) Inventors: John D. Davis, Mountain View, CA (US); John Hayes, Mountain View, CA (US); Zhangxi Tan, Mountain View, CA (US); Hari Kannan, Mountain View, CA (US); Nenad Miladinovic, Mountain View, CA (US)

(73) Assignee: Pure Storage, Inc., Mountain View, CA (US)

( * ) Notice: Subject to any disclaimer, the term of this patent is extended or adjusted under 35 U.S.C. 154(b) by 0 days.

(21) Appl. No.: 14/454,537

(22) Filed: Aug. 7, 2014

(65) Prior Publication Data

US 2016/0041870 A1    Feb. 11, 2016

(51) Int. Cl.
*G06F 11/10*   (2006.01)
*G06F 11/00*   (2006.01)
(Continued)

(52) U.S. Cl.
CPC ....... *G06F 11/1048* (2013.01); *H03M 13/353* (2013.01); *H03M 13/373* (2013.01);
(Continued)

(58) Field of Classification Search
None
See application file for complete search history.

(56) References Cited

U.S. PATENT DOCUMENTS 6,725,392 B1   4/2004   Frey et al.
6,952,794 B2   10/2005  Lu
(Continued)

FOREIGN PATENT DOCUMENTS

WO   WO 2012044489   4/2012
WO   WO 2013030217   3/2013

OTHER PUBLICATIONS

Savill, John, Introduction to Cluster Shared Volumes, Aug. 14, 2011, http://windowsitpro.com/high-availability/introduction-cluster-shared-volumes.*

(Continued)

*Primary Examiner* — Justin R Knapp
(74) *Attorney, Agent, or Firm* — Womble Bond Dickinson (US) LLP

(57) ABSTRACT

A method for adjustable error correction in a storage cluster is provided. The method includes determining health of a non-volatile memory of a non-volatile solid-state storage unit of each of a plurality of storage nodes in a storage cluster on a basis of per flash package, per flash die, per flash plane, per flash block, or per flash page. The determining is performed by the storage cluster. The plurality of storage nodes is housed within a chassis that couples the storage nodes as the storage cluster. The method includes adjusting erasure coding across the plurality of storage nodes based on the health of the non-volatile memory and distributing user data throughout the plurality of storage nodes through the erasure coding. The user data is accessible via the erasure coding from a remainder of the plurality of storage nodes if any of the plurality of storage nodes are unreachable.

20 Claims, 8 Drawing Sheets

(51) Int. Cl.
*H03M 13/35* (2006.01)
*H03M 13/37* (2006.01)
*H03M 13/11* (2006.01)
*H03M 13/15* (2006.01)
*H03M 13/00* (2006.01)

(52) U.S. Cl.
CPC .... *H03M 13/3761* (2013.01); *H03M 13/1102* (2013.01); *H03M 13/1515* (2013.01)

(56) References Cited

U.S. PATENT DOCUMENTS

| | | | |
|---|---|---|---|
| 7,151,694 | B2 | 12/2006 | Meihong et al. |
| 7,472,331 | B2 | 12/2008 | Kim |
| 7,640,452 | B2 | 12/2009 | Chen et al. |
| 7,778,960 | B1 | 8/2010 | Chatterjee et al. |
| 7,869,383 | B2 | 1/2011 | Tabbara et al. |
| 7,908,448 | B1 | 3/2011 | Chatterjee et al. |
| 8,010,485 | B1 | 8/2011 | Chatterjee et al. |
| 8,010,829 | B1 | 8/2011 | Chatterjee et al. |
| 8,046,548 | B1 | 10/2011 | Chatterjee et al. |
| 8,065,573 | B2 | 11/2011 | Abts et al. |
| 8,081,512 | B2 | 12/2011 | Ueno et al. |
| 8,086,911 | B1 | 12/2011 | Taylor |
| 8,103,904 | B2 | 1/2012 | Hafner et al. |
| 8,145,838 | B1 | 3/2012 | Miller et al. |
| 8,156,392 | B2 | 4/2012 | Flynn et al. |
| 8,244,999 | B1 | 8/2012 | Chatterjee et al. |
| 8,296,625 | B2 * | 10/2012 | Diggs et al. ............... 714/762 |
| 8,327,080 | B1 | 12/2012 | Der |
| 8,458,287 | B2 | 6/2013 | Ozzie et al. |
| 8,473,778 | B2 | 6/2013 | Simitci et al. |
| 8,479,037 | B1 | 7/2013 | Chatterjee et al. |
| 8,498,967 | B1 | 7/2013 | Chatterjee et al. |
| 8,522,073 | B2 | 8/2013 | Cohen |
| 8,595,455 | B2 | 11/2013 | Chatterjee et al. |
| 8,621,291 | B2 | 12/2013 | Kinoshita |
| 8,627,136 | B2 | 1/2014 | Shankar et al. |
| 8,683,277 | B1 | 3/2014 | Varnica et al. |
| 8,700,875 | B1 | 4/2014 | Barron et al. |
| 8,775,868 | B2 | 7/2014 | Colgrove et al. |
| 8,799,746 | B2 | 8/2014 | Baker et al. |
| 8,843,447 | B1 | 9/2014 | Molaro et al. |
| 8,850,108 | B1 * | 9/2014 | Hayes et al. ............... 711/103 |
| 8,856,431 | B2 | 10/2014 | Chen |
| 8,856,593 | B2 | 10/2014 | Eckhardt et al. |
| 9,009,565 | B1 | 4/2015 | Northcott |
| 9,122,699 | B2 | 9/2015 | Molaro et al. |
| 9,612,952 | B2 * | 4/2017 | Hayes ............ G06F 12/0238 |
| 2003/0037299 | A1 * | 2/2003 | Smith ....................... 714/763 |
| 2004/0078466 | A1 * | 4/2004 | Coates et al. ............... 709/226 |
| 2008/0295118 | A1 | 11/2008 | Liao |
| 2009/0144598 | A1 * | 6/2009 | Yoon et al. ................. 714/752 |
| 2010/0125670 | A1 * | 5/2010 | Dondeti et al. ............. 709/229 |
| 2010/0268908 | A1 | 10/2010 | Ouyang et al. |
| 2010/0287335 | A1 * | 11/2010 | Chung ................ G11C 16/32 711/103 |
| 2011/0307758 | A1 * | 12/2011 | Fillingim ..................... 714/758 |
| 2012/0079318 | A1 * | 3/2012 | Colgrove et al. ........... 714/6.22 |
| 2012/0226963 | A1 * | 9/2012 | Bivens et al. ............... 714/773 |
| 2012/0272036 | A1 | 10/2012 | Muralimanohar |
| 2013/0060884 | A1 | 3/2013 | Bernbo et al. |
| 2013/0073894 | A1 | 3/2013 | Xavier et al. |
| 2013/0117636 | A1 | 5/2013 | Kim et al. |
| 2013/0205183 | A1 * | 8/2013 | Fillingim et al. ........... 714/773 |
| 2013/0232289 | A1 * | 9/2013 | Zhong et al. ............... 711/102 |
| 2013/0238836 | A1 * | 9/2013 | Suzuki ............ G11C 16/3431 711/103 |
| 2014/0047263 | A1 | 2/2014 | Coatney et al. |
| 2014/0092683 | A1 * | 4/2014 | Hyun ................ G11C 16/32 365/185.09 |
| 2014/0136880 | A1 | 5/2014 | Shankar et al. |
| 2014/0136927 | A1 * | 5/2014 | Li et al. ...................... 714/768 |
| 2014/0189421 | A1 * | 7/2014 | Werner et al. .............. 714/6.21 |
| 2014/0195558 | A1 | 7/2014 | Murthy et al. |

OTHER PUBLICATIONS

Multi-Owner Disk Set Concepts, https://web.archive.org/web/20121013210152/https://docs.oracle.com/cd/E19253-01/816-4520/eqqcx/index.html.*
Storer, Mark W., Greenan, Kevin M., Miller L. Ethan, Voruganti, Kaladhar; Pergamum: Replacing Tape with Energy Efficient, Reliable, Disk-Based Archival Storage.
Hwang, Kai, Jin, Hai, Ho, Roy; RAID-x: A New Distributed Disk Array for I/O-Centric Cluster Computing.
International Search Report, PCT/US2015/044368, dated Feb. 17, 2016.
International Search Report, PCT/US2015/044205, dated Nov. 19, 2015.
Xiao Qin et al.; "Measuring and Analyzing Write Amplification Characteristics of Solid State Disks"; Modeling, Analysis & Simulation of Computer and Telecommunication Systems (MASCOTS), 2013 IEEE 21st International Symposium on Aug. 2013. (http://www.researchgate.net/publication/262362154). See pp. 1-10.
International Search Report and the Written Opinion of the International Searching Authority, PCT/US2015/044522, dated Nov. 30, 2015.
International Search Report, PCT/US2015/044355, dated Feb. 16, 2016.

* cited by examiner

ADJUSTABLE ERROR CORRECTION BASED ON MEMORY HEALTH IN A STORAGE UNIT

BACKGROUND

Solid-state memory, such as flash, is currently in use in solid-state drives (SSD) to augment or replace conventional hard disk drives (HDD), writable CD (compact disk) or writable DVD (digital versatile disk) drives, collectively known as spinning media, and tape drives, for storage of large amounts of data. Flash and other solid-state memories have operation, wear and error characteristics that differ from spinning media. Yet, many solid-state drives are designed to conform to hard disk drive standards for compatibility reasons, which makes it difficult to provide enhanced features or take advantage of unique aspects of flash and other solid-state memory.

It is within this context that the embodiments arise.

SUMMARY

In some embodiments, a method for adjustable error correction in a storage cluster is provided. The method includes determining health of a non-volatile memory of a non-volatile solid-state storage of each of a plurality of storage nodes in a storage cluster on a basis of per package, per die, per plane, per block, or per page. The determining is performed by the storage cluster, wherein the plurality of storage nodes is housed within a chassis that couples the storage nodes as the storage cluster. The method includes adjusting erasure coding across the plurality of storage nodes based on the health of the non-volatile memory. The method includes distributing user data throughout the plurality of storage nodes through the erasure coding, wherein the user data is accessible via the erasure coding from a remainder of the plurality of storage nodes in event of two of the plurality of storage nodes being unreachable.

Other aspects and advantages of the embodiments will become apparent from the following detailed description taken in conjunction with the accompanying drawings which illustrate, by way of example, the principles of the described embodiments.

BRIEF DESCRIPTION OF THE DRAWINGS

The described embodiments and the advantages thereof may best be understood by reference to the following description taken in conjunction with the accompanying drawings. These drawings in no way limit any changes in form and detail that may be made to the described embodiments by one skilled in the art without departing from the spirit and scope of the described embodiments.

DETAILED DESCRIPTION

Figure 1:
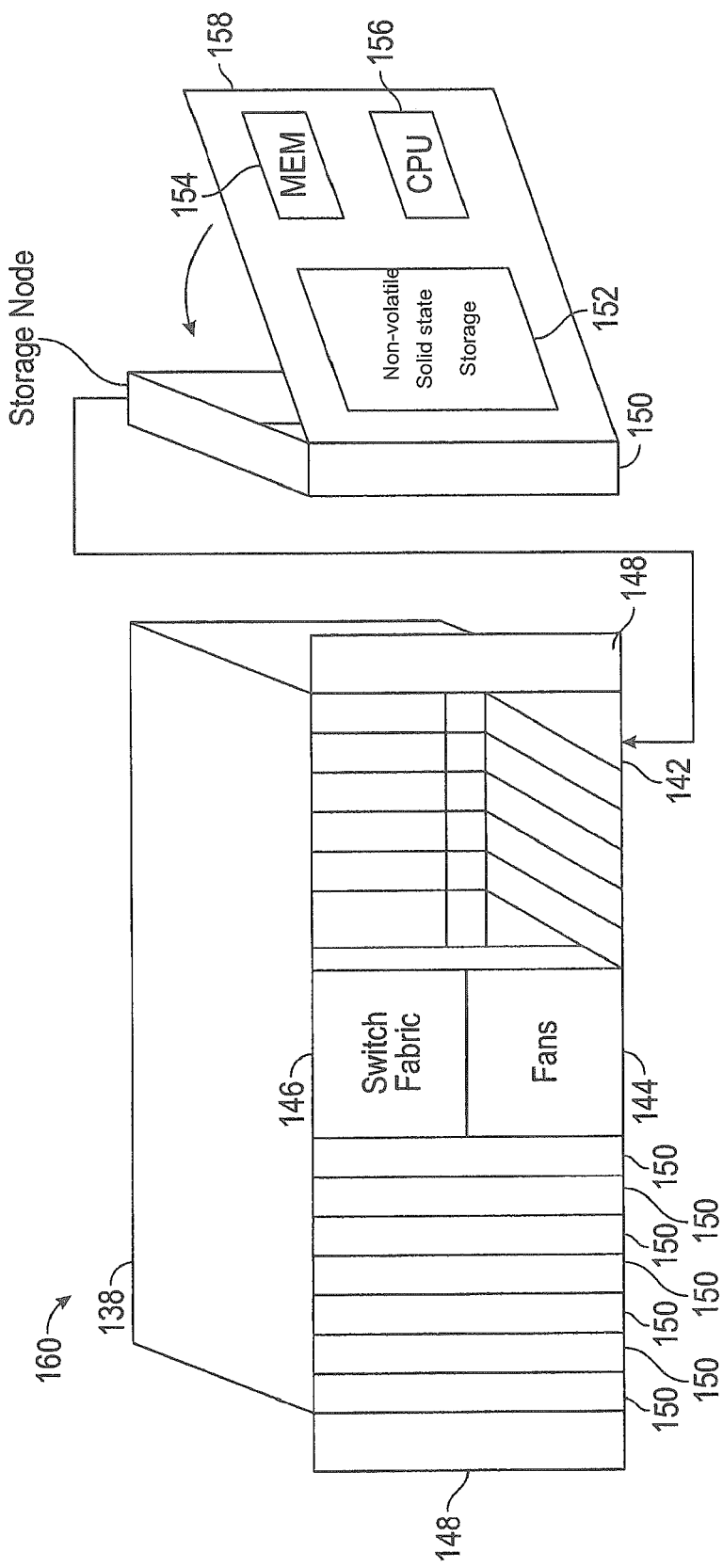
FIG. 1 is a perspective view of a storage cluster with multiple storage nodes and internal storage coupled to each storage node to provide network attached storage, in accordance with some embodiments.

The embodiments below describe a storage cluster that stores user data, such as user data originating from one or more user or client systems or other sources external to the storage cluster. The storage cluster distributes user data across storage nodes housed within a chassis, using erasure coding and redundant copies of metadata. Erasure coding refers to a method of data protection or reconstruction in which data is stored across a set of different locations, such as disks, storage nodes or geographic locations. Flash memory is one type of solid-state memory that may be integrated with the embodiments, although the embodiments may be extended to other types of solid-state memory or other storage medium, including non-solid-state memory. Control of storage locations and workloads are distributed across the storage locations in a clustered peer-to-peer system. Tasks such as mediating communications between the various storage nodes, detecting when a storage node has become unavailable, and balancing I/Os (inputs and outputs) across the various storage nodes, are all handled on a distributed basis. Data is laid out or distributed across multiple storage nodes in data fragments or stripes that support data recovery in some embodiments. Ownership of data can be reassigned within a cluster, independent of input and output patterns. This architecture described in more detail below allows a storage node in the cluster to fail, with the system remaining operational, since the data can be reconstructed from other storage nodes and thus remain available for input and output operations. In various embodiments, a storage node may be referred to as a cluster node, a blade, or a server.

The storage cluster is contained within a chassis, i.e., an enclosure housing one or more storage nodes. A mechanism to provide power to each storage node, such as a power distribution bus, and a communication mechanism, such as a communication bus that enables communication between the storage nodes are included within the chassis. The storage cluster can run as an independent system in one location according to some embodiments. In one embodiment, a chassis contains at least two instances of the power distribution and the internal and external communication bus which may be enabled or disabled independently. The internal communication bus may be an Ethernet bus, however, other technologies such as Peripheral Component Interconnect (PCI) Express, InfiniBand, and others, are equally suitable. The chassis provides a port for an external communication bus for enabling communication between multiple chassis, directly or through a switch, and with client systems. The external communication may use a technology such as Ethernet, InfiniBand, Fibre Channel, etc. In some embodiments, the external communication bus uses different communication bus technologies for inter-chassis and client communication. If a switch is deployed within or between chassis, the switch may act as a translation between multiple protocols or technologies. When multiple chassis are connected to define a storage cluster, the storage cluster may be accessed by a client using either proprietary interfaces or standard interfaces such as network file system (NFS), common internet file system (CIFS), small computer system interface (SCSI) or hypertext transfer protocol (HTTP). Translation from the client protocol may occur at the switch, chassis external communication bus or within each storage node.

Each storage node may be one or more storage servers and each storage server is connected to one or more non-volatile solid-state memory units, which may be referred to as storage units. One embodiment includes a single storage server in each storage node and between one to eight non-volatile solid-state memory units, however this one example is not meant to be limiting. The storage server may include a processor, dynamic random access memory (DRAM) and interfaces for the internal communication bus and power distribution for each of the power buses. Inside the storage node, the interfaces and storage unit share a communication bus, e.g., PCI Express, in some embodiments. The non-volatile solid-state memory units may directly access the internal communication bus interface through a storage node communication bus, or request the storage node to access the bus interface. The non-volatile solid-state memory unit contains an embedded central processing unit (CPU), solid-state storage controller, and a quantity of solid-state mass storage, e.g., between 2-32 terabytes (TB) in some embodiments. An embedded volatile storage medium, such as DRAM, and an energy reserve apparatus are included in the non-volatile solid-state memory unit. In some embodiments, the energy reserve apparatus is a capacitor, super-capacitor, or battery that enables transferring a subset of DRAM contents to a stable storage medium in the case of power loss. In some embodiments, the non-volatile solid-state memory unit is constructed with a storage class memory, such as phase change memory (PCM) or other resistive random access memory (RRAM) or magnetoresistive random access memory (MRAM) that substitutes for DRAM and enables a reduced power hold-up apparatus.

One of many features of the storage nodes and non-volatile solid-state storage units disclosed herein is the ability to adjust error correction based on memory health. Placement of data into flash memory is controlled according to lifecycle stage and reliability determination of blocks or other portions of flash or other types of non-volatile memory in some embodiments. Erasure coding, e.g., stripe width and type of error correction code, can be adjusted for each flash block or other portion of flash memory. For example, level 0 blocks of flash memory could have the least number of bits for error correction code, and level 2 blocks of flash memory could have the most number of bits for error correction code, i.e., the highest level of error correction. This mechanism may be supported on the same flash die. In some embodiments, a storage cluster can perform a health check initially and subsequently at intervals over time. When a new storage node is inserted into the storage cluster, the storage cluster can initiate the health check. Adjustments to erasure coding can occur at the storage node level, the non-volatile solid-state storage unit level, or down at the flash die level. In some embodiments, the storage cluster can determine the type of data and place data into graded or ranked flash blocks or other portions of flash memory according to the type of data.

FIG. 1 is a perspective view of a storage cluster 160, with multiple storage nodes 150 and internal solid-state memory coupled to each storage node to provide network attached storage or storage area network, in accordance with some embodiments. A network attached storage, storage area network, or a storage cluster, or other storage memory, could include one or more storage clusters 160, each having one or more storage nodes 150, in a flexible and reconfigurable arrangement of both the physical components and the amount of storage memory provided thereby. The storage cluster 160 is designed to fit in a rack, and one or more racks can be set up and populated as desired for the storage memory. The storage cluster 160 has a chassis 138 having multiple slots 142. It should be appreciated that chassis 138 may be referred to as a housing, enclosure, or rack unit. In one embodiment, the chassis 138 has fourteen slots 142, although other numbers of slots are readily devised. For example, some embodiments have four slots, eight slots, sixteen slots, thirty-two slots, or other suitable number of slots. Each slot 142 can accommodate one storage node 150 in some embodiments. Chassis 138 includes flaps 148 that can be utilized to mount the chassis 138 on a rack. Fans 144 provide air circulation for cooling of the storage nodes 150 and components thereof, although other cooling components could be used, or an embodiment could be devised without cooling components. A switch fabric 146 couples storage nodes 150 within chassis 138 together and to a network for communication to the memory. In an embodiment depicted in FIG. 1, the slots 142 to the left of the switch fabric 146 and fans 144 are shown occupied by storage nodes 150, while the slots 142 to the right of the switch fabric 146 and fans 144 are empty and available for insertion of storage node 150 for illustrative purposes. This configuration is one example, and one or more storage nodes 150 could occupy the slots 142 in various further arrangements. The storage node arrangements need not be sequential or adjacent in some embodiments. Storage nodes 150 are hot pluggable, meaning that a storage node 150 can be inserted into a slot 142 in the chassis 138, or removed from a slot 142, without stopping or powering down the system. Upon insertion or removal of storage node 150 from slot 142, the system automatically reconfigures in order to recognize and adapt to the change. Reconfiguration, in some embodiments, includes restoring redundancy and/or rebalancing data or load.

Each storage node 150 can have multiple components. In the embodiment shown here, the storage node 150 includes a printed circuit board 158 populated by a CPU 156, i.e., processor, a memory 154 coupled to the CPU 156, and a non-volatile solid-state storage 152 coupled to the CPU 156, although other mountings and/or components could be used in further embodiments. The memory 154 has instructions which are executed by the CPU 156 and/or data operated on by the CPU 156. As further explained below, the non-volatile solid-state storage 152 includes flash or, in further embodiments, other types of solid-state memory.

Figure 2:
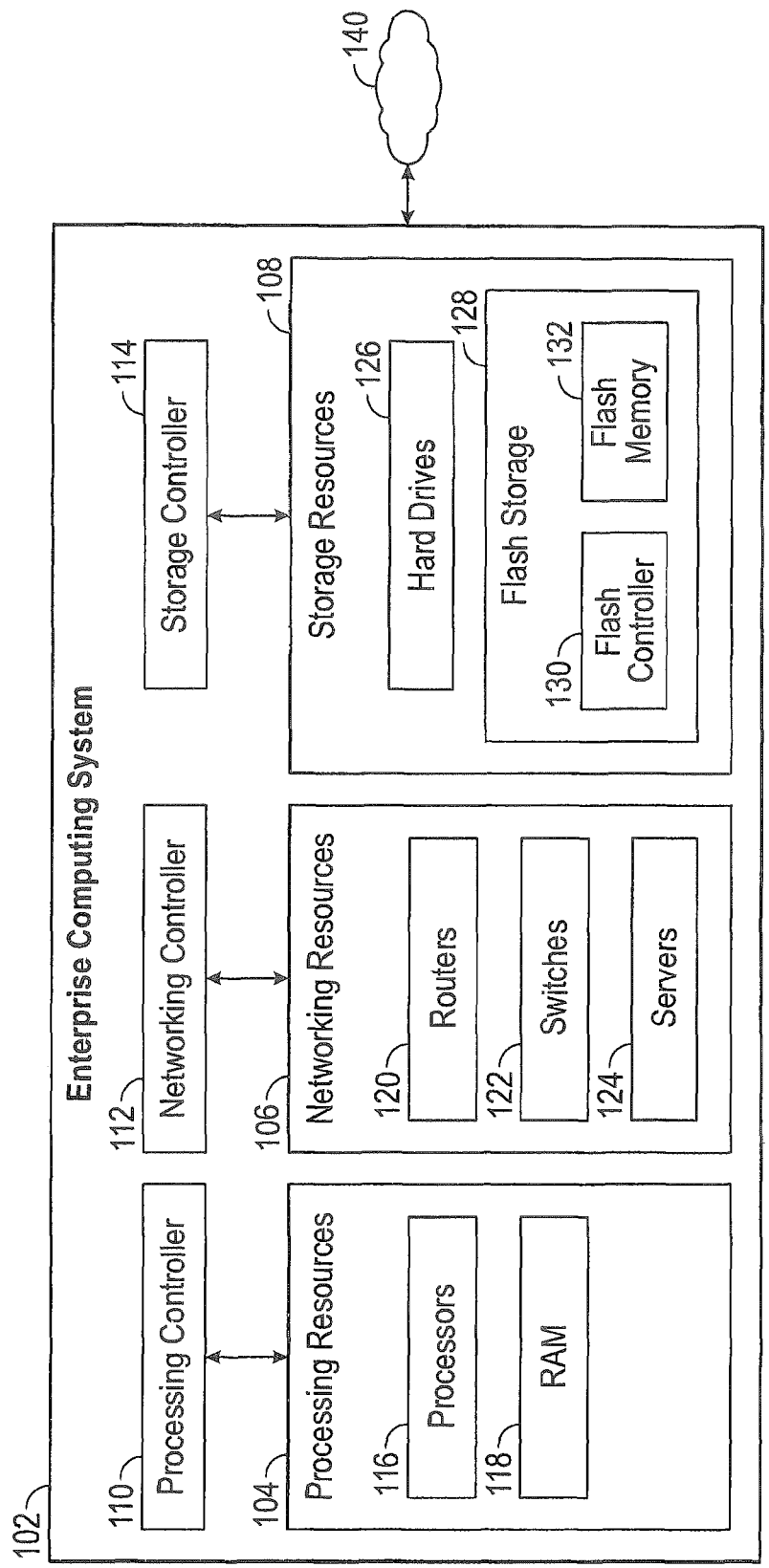
FIG. 2 is a system diagram of an enterprise computing system, which can use one or more of the storage clusters of FIG. 1 as a storage resource in some embodiments.

FIG. 2 is a system diagram of an enterprise computing system 102, which can use one or more of the storage nodes, storage clusters and/or non-volatile solid-state storage of FIG. 1 as a storage resource 108. For example, flash storage 128 of FIG. 2 may integrate the storage nodes, storage clusters and/or non-volatile solid-state storage of FIG. 1 in some embodiments. The enterprise computing system 102 has processing resources 104, networking resources 106 and storage resources 108, including flash storage 128. A flash controller 130 and flash memory 132 are included in the flash storage 128. In various embodiments, the flash storage 128 could include one or more storage nodes or storage clusters, with the flash controller 130 including the CPUs, and the flash memory 132 including the non-volatile solid-state storage of the storage nodes. In some embodiments flash memory 132 may include different types of flash memory or the same type of flash memory. The enterprise computing system 102 illustrates an environment suitable for deployment of the flash storage 128, although the flash storage 128 could be used in other computing systems or devices, larger or smaller, or in variations of the enterprise computing system 102, with fewer or additional resources. The enterprise computing system 102 can be coupled to a network 140, such as the Internet, in order to provide or make use of services. For example, the enterprise computing system 102 could provide cloud services, physical computing resources, or virtual computing services.

In the enterprise computing system 102, various resources are arranged and managed by various controllers. A processing controller 110 manages the processing resources 104, which include processors 116 and random-access memory (RAM) 118. Networking controller 112 manages the networking resources 106, which include routers 120, switches 122, and servers 124. A storage controller 114 manages storage resources 108, which include hard drives 126 and flash storage 128. Other types of processing resources, networking resources, and storage resources could be included with the embodiments. In some embodiments, the flash storage 128 completely replaces the hard drives 126. The enterprise computing system 102 can provide or allocate the various resources as physical computing resources, or in variations, as virtual computing resources supported by physical computing resources. For example, the various resources could be implemented using one or more servers executing software. Files or data objects, or other forms of data, are stored in the storage resources 108.

In various embodiments, an enterprise computing system 102 could include multiple racks populated by storage clusters, and these could be located in a single physical location such as in a cluster or a server farm. In other embodiments the multiple racks could be located at multiple physical locations such as in various cities, states or countries, connected by a network. Each of the racks, each of the storage clusters, each of the storage nodes, and each of the non-volatile solid-state storage could be individually configured with a respective amount of storage space, which is then reconfigurable independently of the others. Storage capacity can thus be flexibly added, upgraded, subtracted, recovered and/or reconfigured at each of the non-volatile solid-state storages. As mentioned previously, each storage node could implement one or more servers in some embodiments.

Figure 3:
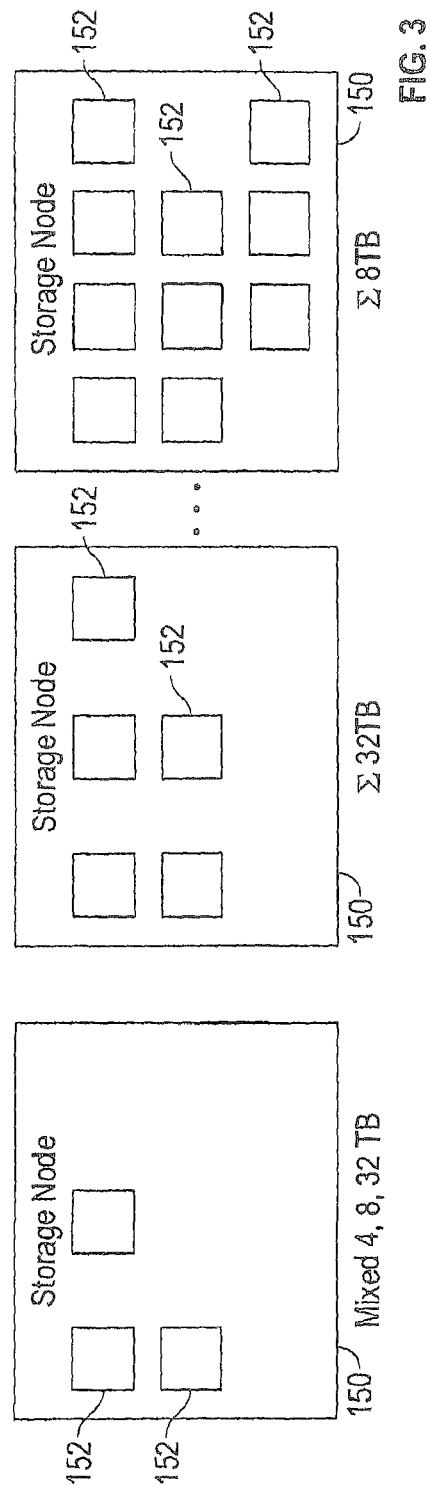
FIG. 3 is a block diagram showing multiple storage nodes and non-volatile solid-state storage with differing capacities, suitable for use in the storage cluster of FIG. 1 in accordance with some embodiments.

FIG. 3 is a block diagram showing multiple storage nodes 150 and non-volatile solid-state storage 152 with differing capacities, suitable for use in the chassis of FIG. 1. Each storage node 150 can have one or more units of non-volatile solid-state storage 152. Each non-volatile solid-state storage 152 may include differing capacity from other non-volatile solid-state storage 152 on a storage node 150 or in other storage nodes 150 in some embodiments. Alternatively, all of the non-volatile solid-state storages 152 on a storage node or on multiple storage nodes can have the same capacity or combinations of the same and/or differing capacities. This flexibility is illustrated in FIG. 3, which shows an example of one storage node 150 having mixed non-volatile solid-state storage 152 of four, eight and thirty-two TB capacity, another storage node 150 having non-volatile solid-state storage 152 each of thirty-two TB capacity, and still another storage node having non-volatile solid-state storage 152 each of eight TB capacity. Various further combinations and capacities are readily devised in accordance with the teachings herein. In the context of clustering, e.g., clustering storage to form a storage cluster, a storage node can be or include a non-volatile solid-state storage 152. Non-volatile solid-state storage 152 is a convenient clustering point as the non-volatile solid-state storage 152 may include a non-volatile random access memory (NVRAM) component, as will be further described below.

Referring to FIGS. 1 and 3, storage cluster 160 is scalable, meaning that storage capacity with non-uniform storage sizes is readily added, as described above. One or more storage nodes 150 can be plugged into or removed from each chassis and the storage cluster self-configures in some embodiments. Plug-in storage nodes 150, whether installed in a chassis as delivered or later added, can have different sizes. For example, in one embodiment a storage node 150 can have any multiple of 4 TB, e.g., 8 TB, 12 TB, 16 TB, 32 TB, etc. In further embodiments, a storage node 150 could have any multiple of other storage amounts or capacities. Storage capacity of each storage node 150 is broadcast, and influences decisions of how to stripe the data. For maximum storage efficiency, an embodiment can self-configure as wide as possible in the stripe, subject to a predetermined requirement of continued operation with loss of up to one, or up to two, non-volatile solid-state storage units 152 or storage nodes 150 within the chassis.

Figure 4:
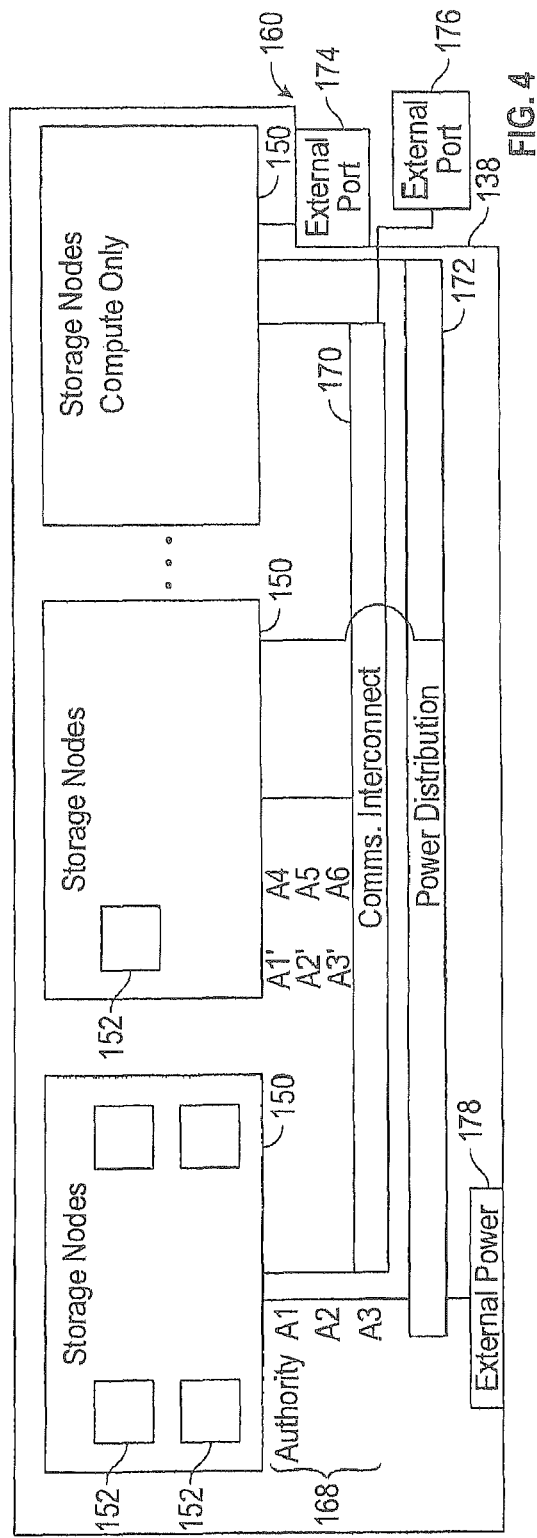
FIG. 4 is a block diagram showing an interconnect switch coupling multiple storage nodes in accordance with some embodiments.

FIG. 4 is a block diagram showing a communications interconnect 170 and power distribution bus 172 coupling multiple storage nodes 150. Referring back to FIG. 1, the communications interconnect 170 can be included in or implemented with the switch fabric 146 in some embodiments. Where multiple storage clusters 160 occupy a rack, the communications interconnect 170 can be included in or implemented with a top of rack switch, in some embodiments. As illustrated in FIG. 4, storage cluster 160 is enclosed within a single chassis 138. External port 176 is coupled to storage nodes 150 through communications interconnect 170, while external port 174 is coupled directly to a storage node. External power port 178 is coupled to power distribution bus 172. Storage nodes 150 may include varying amounts and differing capacities of non-volatile solid-state storage 152 as described with reference to FIG. 3. In addition, one or more storage nodes 150 may be a compute only storage node as illustrated in FIG. 4. Authorities 168, which function to indicate the owner of the data and are discussed in more detail below, are implemented on the non-volatile solid-state storages 152, for example as lists or other data structures stored in memory. In some embodiments the authorities are stored within the non-volatile solid-state storage 152 and supported by software executing on a controller or other processor of the non-volatile solid-state storage 152. In a further embodiment, authorities 168 are implemented on the storage nodes 150, for example as lists or other data structures stored in the memory 154 and supported by software executing on the CPU 156 of the storage node 150. Authorities 168 control how and where data is stored in the non-volatile solid-state storages 152 in some embodiments. This control assists in determining which type of erasure coding scheme is applied to the data, and which storage nodes 150 have which portions of the data. Each authority 168 may be assigned to a non-volatile solid-state storage 152. Each authority may control a range of inode numbers, segment numbers, or other data identifiers which are assigned to data by a file system, by the storage nodes 150, or by the non-volatile solid-state storage 152, in various embodiments.

Every piece of data, and every piece of metadata, has redundancy in the system in some embodiments. In addition, every piece of data and every piece of metadata has an owner, which may be referred to as an authority, e.g., one of the authorities 168 introduced above. If that authority is unreachable, for example through failure of a storage node, there is a plan of succession for how to find that data or that metadata. In various embodiments, there are redundant copies of authorities 168. Authorities 168 have a relationship to storage nodes 150 and non-volatile solid-state storage 152 in some embodiments. Each authority 168, covering a range of data segment numbers or other identifiers of the data, may be assigned to a specific non-volatile solid-state storage 152. In some embodiments the authorities 168 for all of such ranges are distributed over the non-volatile solid-state storages 152 of a storage cluster. Each storage node 150 has a network port that provides access to the non-volatile solid-state storage(s) 152 of that storage node 150. Data can be stored in a segment, which is associated with a segment number and that segment number is an indirection for a configuration of a RAID (redundant array of independent disks) stripe in some embodiments. The assignment and use of the authorities 168 thus establishes an indirection to data. Indirection may be referred to as the ability to reference data indirectly, in this case via an authority 168, in accordance with some embodiments. A segment identifies a set of non-volatile solid-state storage 152 and a local identifier into the set of non-volatile solid-state storage 152 that may contain data. In some embodiments, the local identifier is an offset into the device and may be reused sequentially by multiple segments. In other embodiments the local identifier is unique for a specific segment and never reused. The offsets in the non-volatile solid-state storage 152 are applied to locating data for writing to or reading from the non-volatile solid-state storage 152 (in the form of a RAID stripe). Data is striped across multiple units of non-volatile solid-state storage 152, which may include or be different from the non-volatile solid-state storage 152 having the authority 168 for a particular data segment.

If there is a change in where a particular segment of data is located, e.g., during a data move or a data reconstruction, the authority 168 for that data segment should be consulted, at that non-volatile solid-state storage 152 or storage node 150 having that authority 168. In order to locate a particular piece of data, embodiments calculate a hash value for a data segment or apply an inode number or a data segment number. The output of this operation points to a non-volatile solid-state storage 152 having the authority 168 for that particular piece of data. In some embodiments there are two stages to this operation. The first stage maps an entity identifier (ID), e.g., a segment number, inode number, or directory number to an authority identifier. This mapping may include a calculation such as a hash or a bit mask. The second stage is mapping the authority identifier to a particular non-volatile solid-state storage 152, which may be done through an explicit mapping. The operation is repeatable, so that when the calculation is performed, the result of the calculation repeatably and reliably points to a particular non-volatile solid-state storage 152 having that authority 168. The operation may include the set of reachable storage nodes as input. If the set of reachable non-volatile solid-state storage units changes the optimal set changes. In some embodiments, the persisted value is the current assignment (which is always true) and the calculated value is the target assignment the cluster will attempt to reconfigure towards. This calculation may be used to determine the optimal non-volatile solid-state storage 152 for an authority in the presence of a set of non-volatile solid-state storage 152 that are reachable and constitute the same cluster. The calculation also determines an ordered set of peer non-volatile solid-state storage 152 that will also record the authority to non-volatile solid-state storage mapping so that the authority may be determined even if the assigned non-volatile solid-state storage is unreachable. A duplicate or substitute authority 168 may be consulted if a specific authority 168 is unavailable in some embodiments.

With reference to FIGS. 1-4, two of the many tasks of the CPU 156 on a storage node 150 are to break up write data, and reassemble read data. When the system has determined that data is to be written, the authority 168 for that data is located as above. When the segment ID for data is already determined the request to write is forwarded to the non-volatile solid-state storage 152 currently determined to be the host of the authority 168 determined from the segment. The host CPU 156 of the storage node 150, on which the non-volatile solid-state storage 152 and corresponding authority 168 reside, then breaks up or shards the data and transmits the data out to various non-volatile solid-state storage 152. The transmitted data is written as a data stripe in accordance with an erasure coding scheme. In some embodiments, data is requested to be pulled, and in other embodiments, data is pushed. In reverse, when data is read, the authority 168 for the segment ID containing the data is located as described above. The host CPU 156 of the storage node 150 on which the non-volatile solid-state storage 152 and corresponding authority 168 reside requests the data from the non-volatile solid-state storage and corresponding storage nodes pointed to by the authority. In some embodiments the data is read from flash storage as a data stripe. The host CPU 156 of storage node 150 then reassembles the read data, correcting any errors (if present) according to the appropriate erasure coding scheme, and forwards the reassembled data to the network. In further embodiments, some or all of these tasks can be handled in the non-volatile solid-state storage 152. In some embodiments, the segment host requests the data be sent to storage node 150 by requesting pages from storage and then sending the data to the storage node making the original request.

In some systems, for example in UNIX-style file systems, data is handled with an index node or inode, which specifies a data structure that represents an object in a file system. The object could be a file or a directory, for example. Metadata may accompany the object, as attributes such as permission data and a creation timestamp, among other attributes. A segment number could be assigned to all or a portion of such an object in a file system. In other systems, data segments are handled with a segment number assigned elsewhere. For purposes of discussion, the unit of distribution is an entity, and an entity can be a file, a directory or a segment. That is, entities are units of data or metadata stored by a storage system. Entities are grouped into sets called authorities. Each authority has an authority owner, which is a storage node that has the exclusive right to update the entities in the authority. In other words, a storage node contains the authority, and that the authority, in turn, contains entities.

A segment is a logical container of data in accordance with some embodiments. A segment is an address space between medium address space and physical flash locations, i.e., the data segment number, are in this address space. Segments may also contain meta-data, which enable data redundancy to be restored (rewritten to different flash locations or devices) without the involvement of higher level software. In one embodiment, an internal format of a segment contains client data and medium mappings to determine the position of that data. Each data segment is protected, e.g., from memory and other failures, by breaking the segment into a number of data and parity shards, where applicable. The data and parity shards are distributed, i.e., striped, across non-volatile solid-state storage 152 coupled to the host CPUs 156 (See FIG. 5) in accordance with an erasure coding scheme. Usage of the term segments refers to the container and its place in the address space of segments in some embodiments. Usage of the term stripe refers to the same set of shards as a segment and includes how the shards are distributed along with redundancy or parity information in accordance with some embodiments.

A series of address-space transformations takes place across an entire storage system. At the top is the directory entries (file names) which link to an inode. Modes point into medium address space, where data is logically stored. Medium addresses may be mapped through a series of indirect mediums to spread the load of large files, or implement data services like deduplication or snapshots. Medium addresses may be mapped through a series of indirect mediums to spread the load of large files, or implement data services like deduplication or snapshots. Segment addresses are then translated into physical flash locations. Physical flash locations have an address range bounded by the amount of flash in the system in accordance with some embodiments. Medium addresses and segment addresses are logical containers, and in some embodiments use a 128 bit or larger identifier so as to be practically infinite, with a likelihood of reuse calculated as longer than the expected life of the system. Addresses from logical containers are allocated in a hierarchical fashion in some embodiments. Initially, each non-volatile solid-state storage 152 may be assigned a range of address space. Within this assigned range, the non-volatile solid-state storage 152 is able to allocate addresses without synchronization with other non-volatile solid-state storage 152.

Data and metadata is stored by a set of underlying storage layouts that are optimized for varying workload patterns and storage devices. These layouts incorporate multiple redundancy schemes, compression formats and index algorithms. Some of these layouts store information about authorities and authority masters, while others store file metadata and file data. The redundancy schemes include error correction codes that tolerate corrupted bits within a single storage device (such as a NAND flash chip), erasure codes that tolerate the failure of multiple storage nodes, and replication schemes that tolerate data center or regional failures. In some embodiments, low density parity check (LDPC) code is used within a single storage unit. Reed-Solomon encoding is used within a storage cluster, and mirroring is used within a storage grid in some embodiments. Metadata may be stored using an ordered log structured index (such as a Log Structured Merge Tree), and large data may not be stored in a log structured layout.

In order to maintain consistency across multiple copies of an entity, the storage nodes agree implicitly on two things through calculations: (1) the authority that contains the entity, and (2) the storage node that contains the authority. The assignment of entities to authorities can be done by pseudorandomly assigning entities to authorities, by splitting entities into ranges based upon an externally produced key, or by placing a single entity into each authority. Examples of pseudorandom schemes are linear hashing and the Replication Under Scalable Hashing (RUSH) family of hashes, including Controlled Replication Under Scalable Hashing (CRUSH). In some embodiments, pseudo-random assignment is utilized only for assigning authorities to nodes because the set of nodes can change. The set of authorities cannot change so any subjective function may be applied in these embodiments. Some placement schemes automatically place authorities on storage nodes, while other placement schemes rely on an explicit mapping of authorities to storage nodes. In some embodiments, a pseudorandom scheme is utilized to map from each authority to a set of candidate authority owners. A pseudorandom data distribution function related to CRUSH may assign authorities to storage nodes and create a list of where the authorities are assigned. Each storage node has a copy of the pseudorandom data distribution function, and can arrive at the same calculation for distributing, and later finding or locating an authority. Each of the pseudorandom schemes requires the reachable set of storage nodes as input in some embodiments in order to conclude the same target nodes. Once an entity has been placed in an authority, the entity may be stored on physical devices so that no expected failure will lead to unexpected data loss. In some embodiments, rebalancing algorithms attempt to store the copies of all entities within an authority in the same layout and on the same set of machines.

Examples of expected failures include device failures, stolen machines, datacenter fires, and regional disasters, such as nuclear or geological events. Different failures lead to different levels of acceptable data loss. In some embodiments, a stolen storage node impacts neither the security nor the reliability of the system, while depending on system configuration, a regional event could lead to no loss of data, a few seconds or minutes of lost updates, or even complete data loss.

In the embodiments, the placement of data for storage redundancy is independent of the placement of authorities for data consistency. In some embodiments, storage nodes that contain authorities do not contain any persistent storage. Instead, the storage nodes are connected to non-volatile solid-state storage units that do not contain authorities. The communications interconnect between storage nodes and non-volatile solid-state storage units consists of multiple communication technologies and has non-uniform performance and fault tolerance characteristics. In some embodiments, as mentioned above, non-volatile solid-state storage units are connected to storage nodes via PCI express, storage nodes are connected together within a single chassis using Ethernet backplane, and chassis are connected together to form a storage cluster. Storage clusters are connected to clients using Ethernet or fiber channel in some embodiments. If multiple storage clusters are configured into a storage grid, the multiple storage clusters are connected using the Internet or other long-distance networking links, such as a "metro scale" link or private link that does not traverse the internet.

Authority owners have the exclusive right to modify entities, to migrate entities from one non-volatile solid-state storage unit to another non-volatile solid-state storage unit, and to add and remove copies of entities. This allows for maintaining the redundancy of the underlying data. When an authority owner fails, is going to be decommissioned, or is overloaded, the authority is transferred to a new storage node. Transient failures make it non-trivial to ensure that all non-faulty machines agree upon the new authority location. The ambiguity that arises due to transient failures can be achieved automatically by a consensus protocol such as Paxos, hot-warm failover schemes, via manual intervention by a remote system administrator, or by a local hardware administrator (such as by physically removing the failed machine from the cluster, or pressing a button on the failed machine). In some embodiments, a consensus protocol is used, and failover is automatic. If too many failures or replication events occur in too short a time period, the system goes into a self-preservation mode and halts replication and data movement activities until an administrator intervenes in accordance with some embodiments.

As authorities are transferred between storage nodes and authority owners update entities in their authorities, the system transfers messages between the storage nodes and non-volatile solid-state storage units. With regard to persistent messages, messages that have different purposes are of different types. Depending on the type of the message, the system maintains different ordering and durability guarantees. As the persistent messages are being processed, the messages are temporarily stored in multiple durable and non-durable storage hardware technologies. In some embodiments, messages are stored in RAM, NVRAM and on NAND flash devices, and a variety of protocols are used in order to make efficient use of each storage medium. Latency-sensitive client requests may be persisted in replicated NVRAM, and then later NAND, while background rebalancing operations are persisted directly to NAND.

Persistent messages are persistently stored prior to being replicated. This allows the system to continue to serve client requests despite failures and component replacement. Although many hardware components contain unique identifiers that are visible to system administrators, manufacturer, hardware supply chain and ongoing monitoring quality control infrastructure, applications running on top of the infrastructure address virtualize addresses. These virtualized addresses do not change over the lifetime of the storage system, regardless of component failures and replacements. This allows each component of the storage system to be replaced over time without reconfiguration or disruptions of client request processing.

In some embodiments, the virtualized addresses are stored with sufficient redundancy. A continuous monitoring system correlates hardware and software status and the hardware identifiers. This allows detection and prediction of failures due to faulty components and manufacturing details. The monitoring system also enables the proactive transfer of authorities and entities away from impacted devices before failure occurs by removing the component from the critical path in some embodiments.

Figure 5:
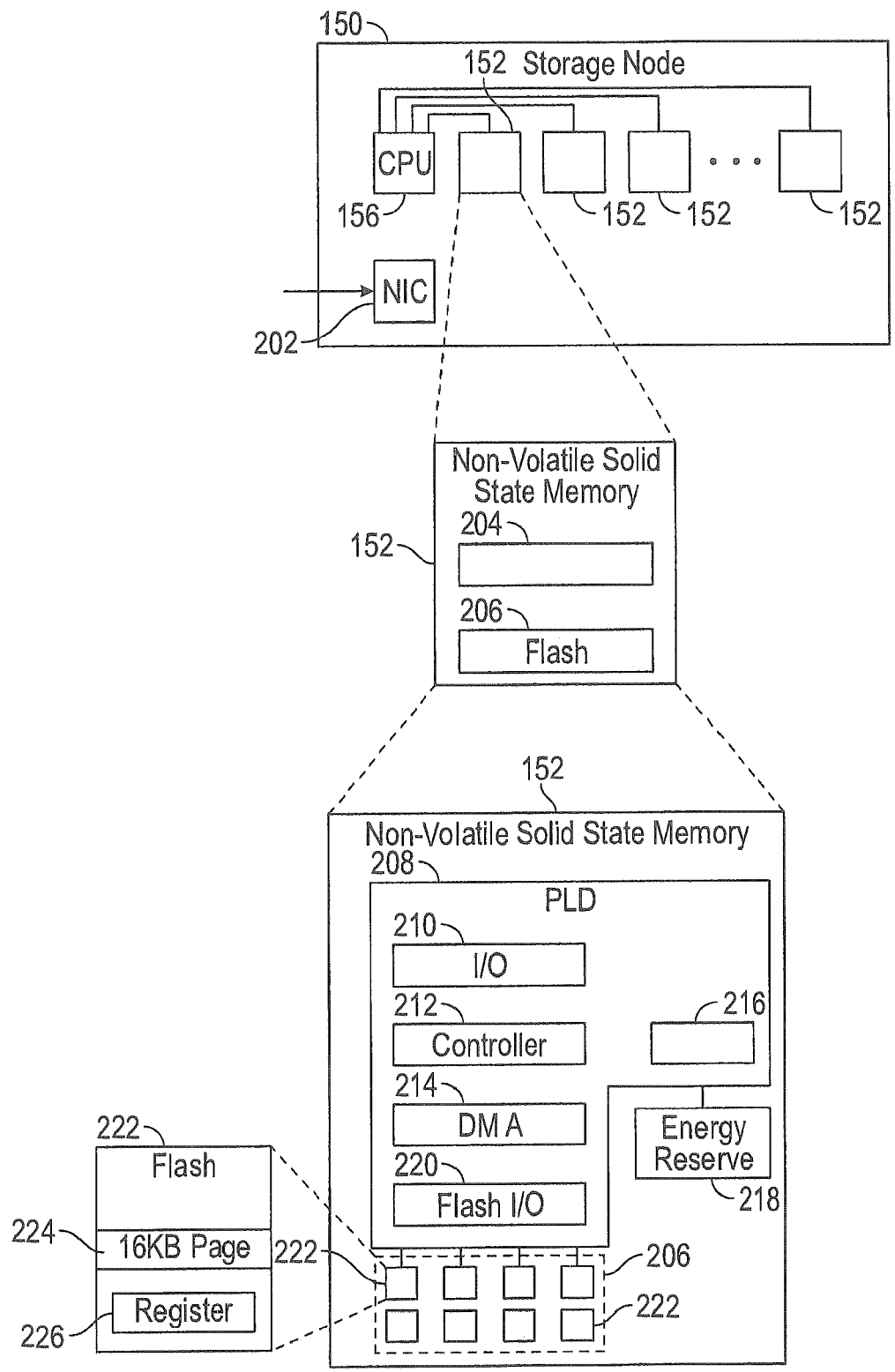
FIG. 5 is a multiple level block diagram, showing contents of a storage node and contents of one of the non-volatile solid-state storage units in accordance with some embodiments.

FIG. 5 is a multiple level block diagram, showing contents of a storage node 150 and contents of a non-volatile solid-state storage 152 of the storage node 150. Data is communicated to and from the storage node 150 by a network interface controller (NIC) 202 in some embodiments. Each storage node 150 has a CPU 156, and one or more non-volatile solid-state storage 152, as discussed above. Moving down one level in FIG. 5, each non-volatile solid-state storage 152 has a relatively fast non-volatile solid-state memory, such as non-volatile random access memory (NVRAM) 204, and flash memory 206. In some embodiments, NVRAM 204 may be a component that does not require program/erase cycles (DRAM, MRAM, PCM), and can be a memory that can support being written vastly more often than the memory is read from. Moving down another level in FIG. 5, the NVRAM 204 is implemented in one embodiment as high speed volatile memory, such as dynamic random access memory (DRAM) 216, backed up by energy reserve 218. Energy reserve 218 provides sufficient electrical power to keep the DRAM 216 powered long enough for contents to be transferred to the flash memory 206 in the event of power failure. In some embodiments, energy reserve 218 is a capacitor, super-capacitor, battery, or other device, that supplies a suitable supply of energy sufficient to enable the transfer of the contents of DRAM 216 to a stable storage medium in the case of power loss. The flash memory 206 is implemented as multiple flash dies 222, which may be referred to as packages of flash dies 222 or an array of flash dies 222. It should be appreciated that the flash dies 222 could be packaged in any number of ways, with a single die per package, multiple dies per package (i.e. multichip packages), in hybrid packages, as dies on a printed circuit board or other substrate. In some embodiments, the hybrid package may include a combination of memory types, such as NVRAM, random access memory (RAM), CPU, field programmable gate array (FPGA), or different sized flash memory in the same package. In the embodiment shown, the non-volatile solid-state storage 152 has a controller 212 or other processor, and an input output (I/O) port 210 coupled to the controller 212. I/O port 210 is coupled to the CPU 156 and/or the network interface controller 202 of the flash storage node 150. Flash input output (I/O) port 220 is coupled to the flash dies 222, and a direct memory access unit (DMA) 214 is coupled to the controller 212, the DRAM 216 and the flash dies 222. In the embodiment shown, the I/O port 210, controller 212, DMA unit 214 and flash I/O port 220 are implemented on a programmable logic device (PLD) 208, e.g., a field programmable gate array (FPGA). In this embodiment, each flash die 222 has pages, organized as sixteen kB (kilobyte) pages 224, and a register 226 through which data can be written to or read from the flash die 222. Various types of flash memory can be used, such as single level cell (SLC) or multilevel cell (MLC, with two or more bits per cell), which can include triple level cell (TLC, with three bits per cell) or quad level cell (QLC, with four bits per cell). In further embodiments, other types of solid-state memory are used in place of, or in addition to flash memory illustrated within flash die 222. Thus, the embodiments may be extended to numerous types of hybrid and non-hybrid packages of memory types.

Figure 6:
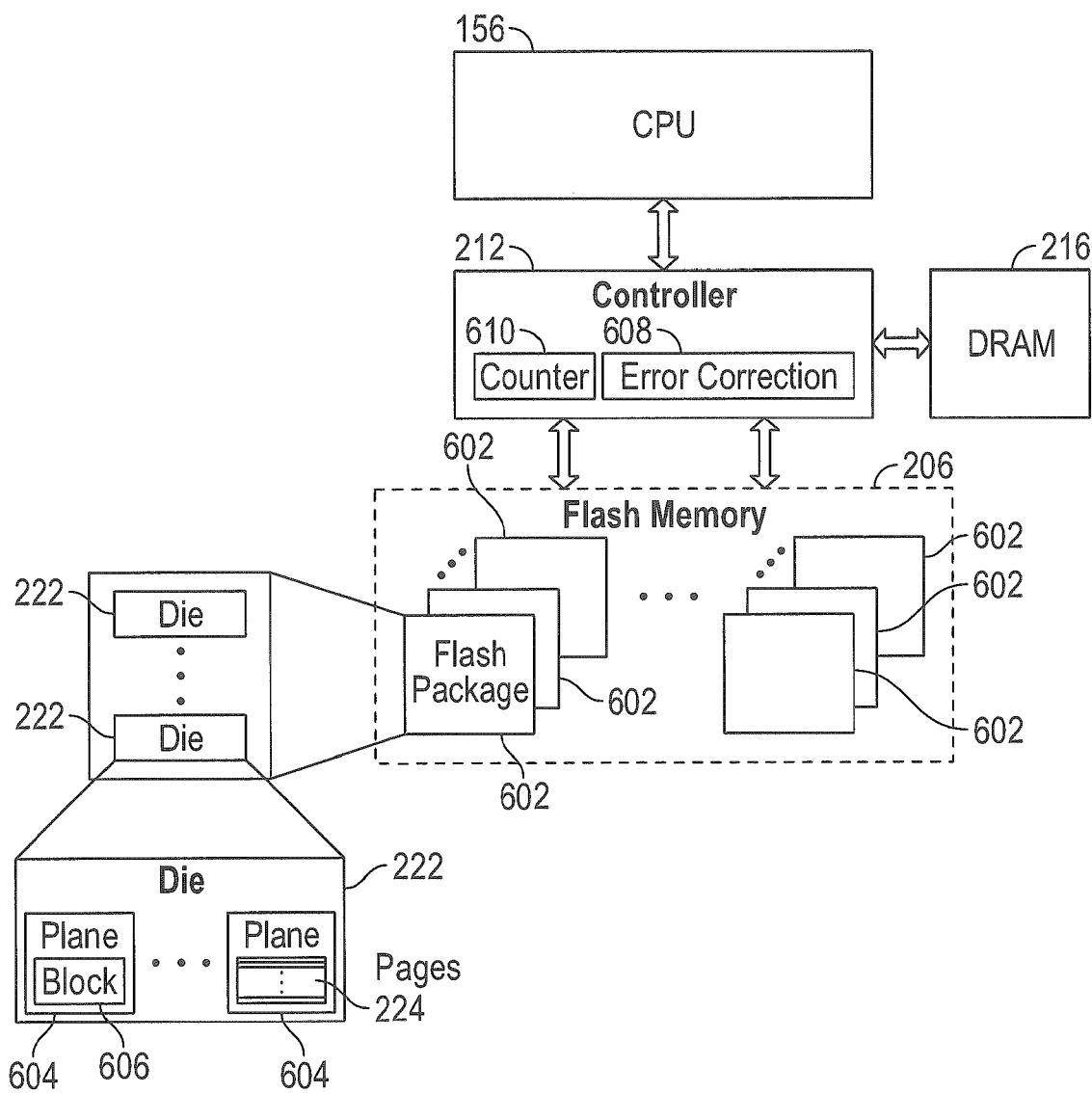
FIG. 6 is a multiple level block diagram, showing a controller, flash dies, and interior details of flash dies in accordance with some embodiments.

FIG. 6 is a multiple level block diagram, showing a controller 212, flash dies 222, and interior details of flash dies 222. Diagnostic information relating to the flash memory 206 can be obtained on a per flash package 602, per flash die 222, per flash plane 604, per flash block 606, and/or per flash page 224 basis across the entirety of a storage cluster 160, in some embodiments. In the example shown in FIG. 6, the flash memory 206 includes multiple flash packages 602. Each flash package 602 includes multiple flash dies 222, each of which in turn includes multiple flash planes 604. Each flash plane 604 includes multiple flash blocks 606 each of which in turn includes multiple flash pages 224. The diagnostic information is gathered or generated by the controller 212 of each non-volatile solid-state storage unit and forwarded to the CPU 156 of the corresponding storage node. In some embodiments, the CPU 156 performs further analysis on the diagnostic information and generates further diagnostic information. The controller 212 and/or the CPU 156 can write the diagnostic information to a memory in the storage cluster, for example the flash memory 206 or the DRAM 216 of a non-volatile solid-state storage unit, the memory 154 (See FIG. 1) coupled to the CPU 156 in a storage node, or other memory of the storage cluster, storage node, or non-volatile solid-state storage unit. The diagnostic information can be stored as metadata, in some embodiments.

One type of diagnostic information is obtained by tracking bit errors per flash page 224 or per codeword. Each flash page 224 has multiple codewords, in some embodiments. Incidents of error correction could be reported and these incidents may be used as a source on which to base the diagnostic information. For example, the controller 212 could track bit errors of the flash memory 206 and forward the information about the bit errors to the CPU 156, which could then tabulate this and/or generate further diagnostic information. Bit errors, or error corrections, can be tracked from feedback from an error correction block 608 in the controller 212 in some embodiments. The CPU 156 or the controller 212 could track wear of flash blocks 606 in the flash memory 206, e.g., by establishing and updating a wear list in memory coupled as described above, responsive to or based on some of the diagnostic information. Such tracking could include ranking flash blocks 606 as to levels of wear, or comparing flash blocks 606 as to levels of wear. The flash memory 206 can be characterized over time, based on the diagnostic information. Characterization information could indicate changes or trends in the flash memory 206, such as increases in the rate of errors or error correction over time. This characterization can be performed at any of the levels of granularity discussed above.

In some embodiments, the CPU 156 sends the diagnostic information, or summarizes the diagnostic information in a report and sends the report, via a network. The diagnostic information or the report could be sent to an appropriate person or organization, which could include an owner or operator of a storage cluster, a manufacturer of storage nodes, a manufacturer of flash memory 206, flash packages 602 or flash dies 222 or other interested or authorized party. These reports could benefit the manufacturers, which can use the information for warranty service and/or to highlight manufacturing and reliability problems and guide improvements. The reports also benefit users, who can plan system maintenance, repairs and upgrades based on the details in the reports. Actual behavior of the flash memory 206 over time can be compared to predicted behavior or to warranties if applicable.

Still referring to FIG. 6, CPU 156 or the controller 212 could make decisions based on the diagnostic information. For example, if it is determined that a flash block 606 has a relatively high level of wear, the CPU 156 or the controller 212 could determine to write some of the user data to another flash block 606 with a lower level of wear. The controller 212 may bias a read from the flash memory, or a write to the flash memory 206, as a response to producing or obtaining the diagnostic information. Depending on the type of flash, and whether specific features are available on flash dies 222, this biasing can take different forms. Biasing the writes or the reads may extend the lifespan of some or all of the flash memory 206. For example, some types of flash dies 222 may support a variable write time, a variable write voltage, a variable read time, a variable reference voltage, a variable reference current or a variable number of reads. The controller 212 could determine, based on the diagnostic information, to direct a flash die 222 to apply a specified value of one of the above variable parameters to a specified write or read. The specified value could be applied to specified writes or reads to flash pages 224, flash blocks 606, flash dies 222, and/or flash packages 602 in some embodiments. Thus, the granularity of the application of variable parameters to writes or reads of the flash memory 206 can match and be supported by the granularity of the diagnostic information itself.

Continuing with the above examples, the variable parameters are applicable to multiple scenarios. In a case where a flash block 606 is experiencing an increase in read errors, the controller 212 could direct the flash block 606 to perform repeated reads at differing reference voltages or reference currents. If a variable reference voltage or a reference current is not available, the controller 212 could perform the multiple reads without varying the reference voltage or current. The controller 212 or the CPU 156 could then perform statistical analysis of the reads and determine a most likely bit value for each read of data in the flash block 606. In cases where a variable write parameter is supported in flash dies 222, a value of a variable write parameter can be selected in an attempt to increase write or read reliability of the flash die 222. Similarly, in cases where a variable read parameter is supported in flash dies 222, a value of a variable read parameter can be selected in an attempt to increase read reliability of the flash die 222. In some embodiments a value for a variable write or read parameter could be selected in response to a determination that some portion of flash memory 206 has greater wear relative to another portion. As a further example, some types of flash dies 222 may have and support changing from multilevel cell (MLC) operation to single cell (SLC) operation. SLC flash has one bit per cell, and MLC flash has more than one bit per cell. The CPU 156 or the controller 212 could direct a flash die 222 to change from MLC operation to SLC operation in order to increase reliability of reads or writes. This change may be in response to determining that some portion of the flash memory 206 has greater wear relative to another portion.

Error correction is adjustable based on memory health, in some embodiments. As described above with reference to FIG. 6, non-volatile solid-state storage units, storage nodes and storage clusters can generate diagnostic information about the flash memory 206 at the level or basis of a flash package 602, a flash die 222, a flash plane 604, a flash block 606, or a flash page 224. In other words, the system tracks aspects of accesses to the flash memory 206, then analyzes and produces diagnostic information regarding the health of individual flash packages 602, flash dies 222, flash planes 604, flash blocks 606, or flash pages 224 of the flash memory 206. The diagnostic information can include or be based on error counts, error correction counts, error rates, error correction rates, counts of the number of writes, counts of the number of reads, counts of the number of erasure cycles or other aspects of the flash memory 206. In some embodiments, the diagnostic information is further based on properties of the data itself, such as actual or predicted data retention time, file types or data types (e.g., operating system data, text-based data, image-based data, video data and so on).

Various embodiments perform a system health check, including a health check of the flash memory 206, or just perform the health check of the flash memory 206, at various intervals in the lifespan of the flash memory 206. For example, an initial health check could be performed when a system is first assembled and powered up. This health check could include performing a write, read and erasure cycle on the flash memory 206, recording the diagnostic information, and initially setting erasure coding across the storage nodes and non-volatile solid-state storage units. A health check is performed at predetermined intervals, and/or is performed upon being triggered by a parameter reaching a threshold. In a further embodiment, the health check can be always on as opposed to periodically being invoked. For example, the system could track error counts or rates, error correction counts or rates, reads, or writes, using a counter 610 inside of or coupled to the error correction block 608 or the controller 212 of a non-volatile solid-state storage 152. If one of these counts reaches a predetermined threshold, the health check is triggered. These rates could be rates over time or rates per number of memory accesses, etc. In one embodiment, a health check is performed upon insertion of a storage node into a storage cluster. This health check assesses the flash memory 206 of each of the non-volatile solid-state storage units, including the flash memory 206 of the newly inserted storage node. Alternatively, if a health check of the other non-volatile solid-state storage units has been perform recently the health check may be limited to checking the flash memory 206 of the newly inserted storage node.

As mentioned above, erasure coding is adjusted based on the memory health. The erasure coding may be adjusted at the level of the storage nodes, the non-volatile solid-state storage unit, individual flash packages 602, flash dies 222, flash plane 604, flash block 606, or flash pages 224. For example, in some embodiments, erasure coding is adjusted on a per flash block 606 basis. That is, each flash block 606 may be part of a data striping scheme and error correction code scheme. In some embodiments, this takes the form of grading or ranking the flash blocks 606. Embodiments could assign a grade or rank to individual flash blocks 606, e.g., level 0, level 1, level 2, and assign one data striping scheme and error correction code scheme to level 0 flash blocks 606, a differing data striping scheme and error correction code scheme to level 1 flash blocks 606, and a yet further data striping scheme and error correction code scheme to level 2 flash blocks 606. A particular flash die 222 may have one or more flash blocks 606 at level 0, one or more flash blocks 606 at level 1, and/or one or more flash block 606 at level 2. The above examples can be extended to apply to other portions of the flash memory 206 at the levels or per portion basis described above.

In some embodiments, user data is placed into graded or ranked portions of flash memory 206 based on the type of user data. For example, the storage cluster, storage node and/or non-volatile solid-state storage unit could determine the type of user data and place one or more types of user data into level 0 flash blocks 606, and other types of user data into level 1 flash blocks 606 or level 2 flash blocks 606, etc. The determination of type of user data could be based on file extension or other characteristics of the user data. For example, operating system files, executable files, image files, text files, audio files, video files, frequently accessed files, seldom accessed files, backup images, data with a planned short, medium or long retention time, and other types of files and file types can be identified or determined and stored accordingly. Files with a file type determined to need high reliability (e.g., operating system files, executable files, database files) could be placed in flash blocks 606 that are graded for highest reliability. Files with a file type determined to be more tolerant of a lower level of reliability (e.g., image or audio files) could be placed in flash blocks 606 that are graded for a lower reliability (e.g., that have a higher error count or rate). Files with a file type determined to need most rapid access times could be placed in flash blocks 606 that are graded for fast access times, while files with a file type determined to have a slower acceptable access time (e.g., audio files, smaller text files) could be placed in flash blocks 606 that are graded for slower access times. Various criteria for grading the flash blocks 606 or other portions of the flash memory 206, various criteria for determining types of user data, and various assignments of types of user data to graded portions of flash memory 206 are readily devised in accordance with the teachings herein.

Figure 7:
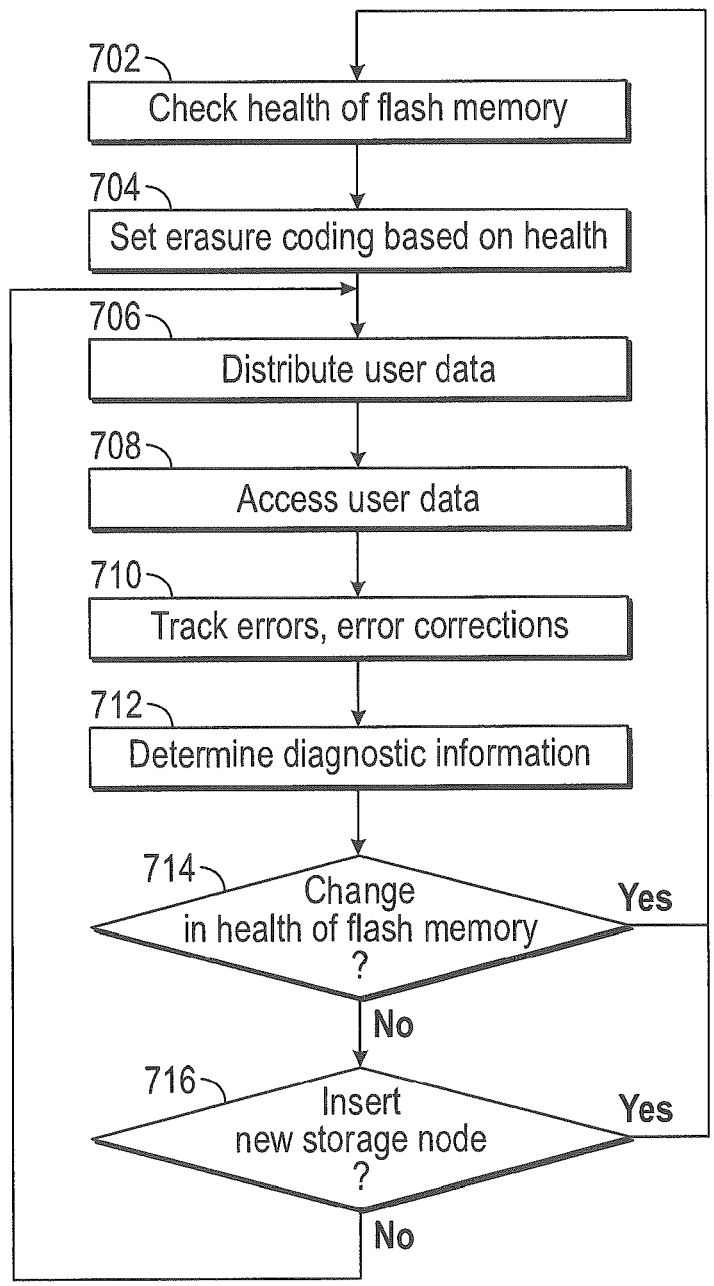
FIG. 7 is a flow diagram of a method for adjustable error correction in a storage cluster, which can be practiced on or by embodiments of the storage cluster, storage nodes and/or non-volatile solid-state storages in accordance with some embodiments.

FIG. 7 is a flow diagram of a method for adjustable error correction in a storage cluster, which can be practiced on or by embodiments of the storage cluster, storage nodes and/or non-volatile solid-state storages in accordance with some embodiments. Actions of the method can be performed by a processor, such as the CPU of a storage node or the controller of a non-volatile solid-state storage. The health of the flash memory in the storage cluster is checked, in an action 702. The health check can be performed by the controller of each of the non-volatile solid-state storages and/or by the CPU of each of the storage nodes at various levels of granularity. Erasure coding is set based on the health of the flash memory, in an action 704. The erasure coding can be set at various levels of granularity as described above. User data is distributed, in an action 706. The user data is distributed throughout the storage nodes through erasure coding. In some embodiments, the user data is distributed according to type of user data and grading of portions of flash memory. User data is accessed, in an action 708. The user data can be accessed even if two of the storage nodes are unreachable in the storage cluster housed within the chassis.

Still referring to FIG. 7, errors and/or error corrections are tracked, in an action 710. The errors and/or error corrections can be tracked by the controller of each of the non-volatile solid-state storages, in conjunction with the error correction block and a counter. Diagnostic information is determined, in an action 712. The error or error correction counts, the diagnostic information, and the erasure coding determinations can be stored as metadata in some embodiments. In a decision action 714, it is determined if there is a change in the health of the flash memory. This determination is based on the diagnostic information determined in the action 712. For example, if one or more parameters in the diagnostic information reaches or exceeds a predefined threshold, this could be indicative of a change in the health of the flash memory. If the answer is yes, there is a change in the health of the flash memory, flow branches back to the action 702, in order to check the health of the flash memory and set erasure coding based on the health. If the answer is no, there is no change in the health of the flash memory, the method continues to decision action 716. In decision action 716, it is determined if there is a new storage node inserted into the storage cluster. If the answer is yes, there is a new storage node, flow branches back to the action 702, in order to check the health of the flash memory, including flash memory in the new storage node, and set erasure coding based on the health. If the answer is no, there is no new storage node, flow branches back to the action 706, in order to continue distributing and accessing user data. In variations of the above method, the diagnostic information and/or the health checks are performed at other times and based on other triggers.

Figure 8:
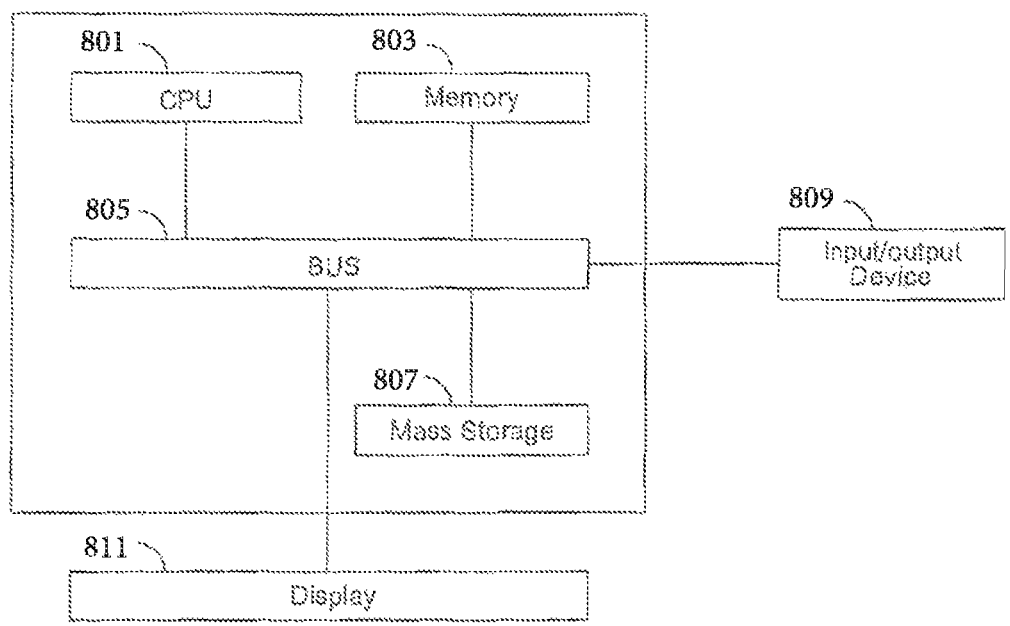
FIG. 8 is an illustration showing an exemplary computing device which may implement the embodiments described herein.

It should be appreciated that the methods described herein may be performed with a digital processing system, such as a conventional, general-purpose computer system. Special purpose computers, which are designed or programmed to perform only one function may be used in the alternative. FIG. 8 is an illustration showing an exemplary computing device which may implement the embodiments described herein. The computing device of FIG. 8 may be used to perform embodiments of the functionality for a storage node or a non-volatile solid-state storage in accordance with some embodiments. The computing device includes a central processing unit (CPU) 801, which is coupled through a bus 805 to a memory 803, and mass storage device 807. Mass storage device 807 represents a persistent data storage device such as a disc drive, which may be local or remote in some embodiments. The mass storage device 807 could implement a backup storage, in some embodiments. Memory 803 may include read only memory, random access memory, etc. Applications resident on the computing device may be stored on or accessed via a computer readable medium such as memory 803 or mass storage device 807 in some embodiments. Applications may also be in the form of modulated electronic signals modulated accessed via a network modem or other network interface of the computing device. It should be appreciated that CPU 801 may be embodied in a general-purpose processor, a special purpose processor, or a specially programmed logic device in some embodiments.

Display 811 is in communication with CPU 801, memory 803, and mass storage device 807, through bus 805. Display 811 is configured to display any visualization tools or reports associated with the system described herein. Input/output device 809 is coupled to bus 805 in order to communicate information in command selections to CPU 801. It should be appreciated that data to and from external devices may be communicated through the input/output device 809. CPU 801 can be defined to execute the functionality described herein to enable the functionality described with reference to FIGS. 1-7. The code embodying this functionality may be stored within memory 803 or mass storage device 807 for execution by a processor such as CPU 801 in some embodiments. The operating system on the computing device may be MS-WINDOWS™, UNIX™, LINUX™, iOS™, CentOS™, Android™, Redhat Linux™, z/OS™, or other known operating systems. It should be appreciated that the embodiments described herein may be integrated with virtualized computing system also.

Detailed illustrative embodiments are disclosed herein. However, specific functional details disclosed herein are merely representative for purposes of describing embodiments. Embodiments may, however, be embodied in many alternate forms and should not be construed as limited to only the embodiments set forth herein.

It should be understood that although the terms first, second, etc. may be used herein to describe various steps or calculations, these steps or calculations should not be limited by these terms. These terms are only used to distinguish one step or calculation from another. For example, a first calculation could be termed a second calculation, and, similarly, a second step could be termed a first step, without departing from the scope of this disclosure. As used herein, the term "and/or" and the "/" symbol includes any and all combinations of one or more of the associated listed items.

As used herein, the singular forms "a", "an" and "the" are intended to include the plural forms as well, unless the context clearly indicates otherwise. It will be further understood that the terms "comprises", "comprising", "includes", and/or "including", when used herein, specify the presence of stated features, integers, steps, operations, elements, and/or components, but do not preclude the presence or addition of one or more other features, integers, steps, operations, elements, components, and/or groups thereof. Therefore, the terminology used herein is for the purpose of describing particular embodiments only and is not intended to be limiting.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

With the above embodiments in mind, it should be understood that the embodiments might employ various computer-implemented operations involving data stored in computer systems. These operations are those requiring physical manipulation of physical quantities. Usually, though not necessarily, these quantities take the form of electrical or magnetic signals capable of being stored, transferred, combined, compared, and otherwise manipulated. Further, the manipulations performed are often referred to in terms, such as producing, identifying, determining, or comparing. Any of the operations described herein that form part of the embodiments are useful machine operations. The embodiments also relate to a device or an apparatus for performing these operations. The apparatus can be specially constructed for the required purpose, or the apparatus can be a general-purpose computer selectively activated or configured by a computer program stored in the computer. In particular, various general-purpose machines can be used with computer programs written in accordance with the teachings herein, or it may be more convenient to construct a more specialized apparatus to perform the required operations.

A module, an application, a layer, an agent or other method-operable entity could be implemented as hardware, firmware, or a processor executing software, or combinations thereof. It should be appreciated that, where a software-based embodiment is disclosed herein, the software can be embodied in a physical machine such as a controller. For example, a controller could include a first module and a second module. A controller could be configured to perform various actions, e.g., of a method, an application, a layer or an agent.

The embodiments can also be embodied as computer readable code on a non-transitory computer readable medium. The computer readable medium is any data storage device that can store data, which can be thereafter read by a computer system. Examples of the computer readable medium include hard drives, network attached storage (NAS), read-only memory, random-access memory, CD-ROMs, CD-Rs, CD-RWs, magnetic tapes, and other optical and non-optical data storage devices. The computer readable medium can also be distributed over a network coupled computer system so that the computer readable code is stored and executed in a distributed fashion. Embodiments described herein may be practiced with various computer system configurations including hand-held devices, tablets, microprocessor systems, microprocessor-based or programmable consumer electronics, minicomputers, mainframe computers and the like. The embodiments can also be practiced in distributed computing environments where tasks are performed by remote processing devices that are linked through a wire-based or wireless network.

Although the method operations were described in a specific order, it should be understood that other operations may be performed in between described operations, described operations may be adjusted so that they occur at slightly different times or the described operations may be distributed in a system which allows the occurrence of the processing operations at various intervals associated with the processing.

In various embodiments, one or more portions of the methods and mechanisms described herein may form part of a cloud-computing environment. In such embodiments, resources may be provided over the Internet as services according to one or more various models. Such models may include Infrastructure as a Service (IaaS), Platform as a Service (PaaS), and Software as a Service (SaaS). In IaaS, computer infrastructure is delivered as a service. In such a case, the computing equipment is generally owned and operated by the service provider. In the PaaS model, software tools and underlying equipment used by developers to develop software solutions may be provided as a service and hosted by the service provider. SaaS typically includes a service provider licensing software as a service on demand. The service provider may host the software, or may deploy the software to a customer for a given period of time. Numerous combinations of the above models are possible and are contemplated.

Various units, circuits, or other components may be described or claimed as "configured to" perform a task or tasks. In such contexts, the phrase "configured to" is used to connote structure by indicating that the units/circuits/components include structure (e.g., circuitry) that performs the task or tasks during operation. As such, the unit/circuit/component can be said to be configured to perform the task even when the specified unit/circuit/component is not currently operational (e.g., is not on). The units/circuits/components used with the "configured to" language include hardware—for example, circuits, memory storing program instructions executable to implement the operation, etc. Reciting that a unit/circuit/component is "configured to" perform one or more tasks is expressly intended not to invoke 35 U.S.C. 112, sixth paragraph, for that unit/circuit/component. Additionally, "configured to" can include generic structure (e.g., generic circuitry) that is manipulated by software and/or firmware (e.g., an FPGA or a general-purpose processor executing software) to operate in manner that is capable of performing the task(s) at issue. "Configured to" may also include adapting a manufacturing process (e.g., a semiconductor fabrication facility) to fabricate devices (e.g., integrated circuits) that are adapted to implement or perform one or more tasks.

The foregoing description, for the purpose of explanation, has been described with reference to specific embodiments. However, the illustrative discussions above are not intended to be exhaustive or to limit the invention to the precise forms disclosed. Many modifications and variations are possible in view of the above teachings. The embodiments were chosen and described in order to best explain the principles of the embodiments and its practical applications, to thereby enable others skilled in the art to best utilize the embodiments and various modifications as may be suited to the particular use contemplated. Accordingly, the present embodiments are to be considered as illustrative and not restrictive, and the invention is not to be limited to the details given herein, but may be modified within the scope and equivalents of the appended claims.

What is claimed is:

1. A method, comprising:
    determining health of a plurality of storage nodes in a storage cluster, wherein a plurality of authorities is located within the plurality of storage nodes, each authority owning a range of user data, and wherein two authorities of the plurality of authorities are located within a first storage node of the plurality of storage nodes;
    adjusting a variable read time supported by one or more flash dies in nonvolatile memory of the storage cluster to increase read reliability, based on the health of the plurality of storage nodes; and
    adjusting erasure coding based on the health of the plurality of storage nodes.

2. The method of claim 1, further comprising:
    ranking portions of non-volatile memory of at least one of the plurality of storage nodes based on the health of the at least one of the plurality of storage nodes, wherein adjusting the erasure coding includes assigning differing numbers of bits for error correction code (ECC) to differing portions of the non-volatile memory of the at least one of the plurality of storage nodes according to the ranking.

3. The method of claim 1, wherein adjusting the erasure coding comprises:
    adjusting a stripe width and a type of error correction code (ECC).

4. The method of claim 1, wherein each of one or more storage nodes in the storage cluster has more than one of the plurality of authorities therein.

5. The method of claim 1, further comprising:
    moving one or more of the plurality of authorities from one storage node to another storage node in the storage cluster.

6. The method of claim 1, wherein determining the health of each of the plurality of storage nodes includes producing diagnostic information on a basis of per package, per die, per plane, per block, or per page.

7. The method of claim 1, further comprising:
    grading a plurality of portions of non-volatile memory of at least one of the plurality of storage nodes per the health of the at least one of the plurality of storage nodes, wherein adjusting the erasure coding includes assigning a plurality of levels of data stripes or error correction code to the plurality of portions of the non-volatile memory according to the grading.

8. The method of claim 1, further comprising:
    assigning a plurality of grades to non-volatile memory of at least one of the plurality of storage nodes according to the health of the at least one of the plurality of storage nodes.

9. A plurality of storage nodes, comprising:
    the plurality of storage nodes configured to communicate together as a storage cluster, each of the plurality of storage nodes having non-volatile memory for user data storage, the plurality of storage nodes configured to determine health of the non-volatile memory;
    a plurality of authorities located within the plurality of storage nodes, wherein each authority owns a range of user data and wherein two authorities of the plurality of authorities are located within a first storage node of the plurality of storage nodes; and
    at least one of the plurality of storage nodes having more than one of the plurality of storage nodes and the at least one of the plurality of storage nodes configurable to adjust a variable read time supported by the one or more flash dies of the storage cluster, responsive to determining the health of the non-volatile memory.

10. The plurality of storage nodes of claim 9, wherein each of one or more of the plurality of storage nodes has more than one of the plurality of authorities.

11. The plurality of storage nodes of claim 9, further comprising:
    the plurality of storage nodes configurable to perform a greater number of read retries for a first portion of the non-volatile memory of at least one of the plurality of storage nodes that has undergone a greater number of write and erase cycles than for a second portion of the non-volatile memory of the at least one of the plurality of storage nodes that has undergone a lesser number of write and erase cycles.

12. The plurality of storage nodes of claim 9, wherein at least one of the plurality of authorities is configurable to be transferred from a storage node to another storage node in the storage cluster.

13. The plurality of storage nodes of claim 9, wherein the plurality of storage nodes is configurable to adjust the erasure coding at the level of a package, a die, a plane, a block, or a page, and wherein each storage node of the plurality of storage nodes includes a controller.

14. The plurality of storage nodes of claim 9, further comprising:
the plurality of storage nodes configurable to grade blocks according to the health of the non-volatile memory of at least one of the plurality of storage nodes.

15. A storage cluster, comprising:
a plurality of storage nodes, each of the plurality of storage nodes having non-volatile memory for storage of user data, the plurality of storage nodes configurable to generate diagnostic information regarding health of the non-volatile memory of each of the plurality of storage nodes;
at least one authority located within each storage node of the plurality of storage nodes and at least two authorities located within a first storage node of the plurality of storage nodes, so that there is a plurality of authorities in the plurality of storage nodes, with each of the plurality of authorities having ownership of a range of data; and
the plurality of storage nodes configurable to adjust a variable read time supported by the one or more flash dies in the nonvolatile memory of the storage cluster, based on the health of the non-volatile memory of at least one of the plurality of storage nodes.

16. The storage cluster of claim 15, further comprising:
an error correction block configurable to track errors or error corrections in reads of the non-volatile memory of at the least one of the plurality of storage nodes, wherein the diagnostic information regarding the health is based at least in part on the errors or error corrections.

17. The storage cluster of claim 15, further comprising:
a counter configurable to count how many times the non-volatile memory of the at least one of the plurality of storage nodes is written to on a per package basis, a per die basis, a per plane basis, a per block basis, or a per page basis, wherein the diagnostic information regarding the health is based at least in part on a result from the counter.

18. The storage cluster of claim 15, further comprising:
the plurality of storage nodes configurable to rank blocks of the non-volatile memory of the at least one of the plurality of storage nodes according to the health of the non-volatile memory of the at least one of the plurality of storage nodes.

19. The storage cluster of claim 15, wherein one of the plurality of storage nodes has more than one of the plurality of authorities.

20. The storage cluster of claim 15, wherein each of one or more of the plurality of storage nodes is a compute-only node.

* * * * *